(12) United States Patent
Motegi et al.

(10) Patent No.: US 11,495,480 B2
(45) Date of Patent: Nov. 8, 2022

(54) SUBSTRATE PROCESSING SYSTEM

(71) Applicant: TOKYO ELECTRON LIMITED, Tokyo (JP)

(72) Inventors: Suguru Motegi, Miyagi (JP); Takashi Kumagai, Miyagi (JP); Akira Kodashima, Miyagi (JP); Keisuke Yoshimura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 2 days.

(21) Appl. No.: 16/999,024

(22) Filed: Aug. 20, 2020

(65) Prior Publication Data
US 2021/0057243 A1 Feb. 25, 2021

(30) Foreign Application Priority Data

Aug. 22, 2019 (JP) .............................. JP2019-151748

(51) Int. Cl.
*H01L 21/67* (2006.01)
*H01J 37/32* (2006.01)

(52) U.S. Cl.
CPC .... *H01L 21/67173* (2013.01); *H01J 37/3288* (2013.01); *H01J 37/32715* (2013.01); *H01J 37/32733* (2013.01); *H01J 37/32807* (2013.01); *H01J 37/32899* (2013.01); *H01J 37/32908* (2013.01); *H01L 21/6719* (2013.01); *H01L 21/67167* (2013.01); *H01J 2237/20285* (2013.01)

(58) Field of Classification Search
None
See application file for complete search history.

(56) References Cited

U.S. PATENT DOCUMENTS

| 2005/0193948 | A1* | 9/2005 | Oohirabaru | ......... H01L 21/6719 118/719 |
| 2006/0278612 | A1* | 12/2006 | Tokunaga | ......... H01L 21/67167 216/58 |
| 2015/0086302 | A1* | 3/2015 | Senzaki | .............. H01L 21/6719 414/222.13 |
| 2017/0092516 | A1* | 3/2017 | van Gogh | ......... H01L 21/67733 |

FOREIGN PATENT DOCUMENTS

JP 2017-69564 A 4/2017

* cited by examiner

*Primary Examiner* — Karla A Moore
(74) *Attorney, Agent, or Firm* — Weihrouch IP

(57) ABSTRACT

A substrate processing system installed on a floor face is provided. The substrate processing system includes a substrate transfer module, a supporting table including a top plate disposed separately from the floor face, a plurality of substrate processing modules disposed on the top plate and coupled to the substrate transfer module along a lateral side of the substrate transfer module, and a plurality of power units disposed below the top plate. Further, the plurality of power units correspond to the plurality of substrate processing modules, respectively, and each of the power units is configured to supply electric power to the corresponding processing module.

2 Claims, 9 Drawing Sheets

SUBSTRATE PROCESSING SYSTEM

CROSS-REFERENCE TO RELATED APPLICATIONS

This application claims priority to Japanese Patent Application No. 2019-151748, filed on Aug. 22, 2019, the entire contents of which are incorporated herein by reference.

TECHNICAL FIELD

The present disclosure relates to a substrate processing system.

BACKGROUND

Japanese Patent Application Publication No. 2017-69564 discloses a configuration in which a plurality of processing chambers and a transfer module for transferring a substrate to each processing chamber are arranged on a different floor from a plurality of power units for respectively supplying electric power to the processing chambers in a semiconductor manufacturing factory.

The present disclosure provides a technique for suppressing an increase of an installation area.

SUMMARY

In accordance with an aspect of the present disclosure, there is provided a substrate processing system installed on a floor face, including: a substrate transfer module; a supporting table including a top plate disposed separately from the floor face; a plurality of substrate processing modules disposed on the top plate and coupled to the substrate transfer module along a lateral side of the substrate transfer module; and a plurality of power units disposed below the top plate, the plurality of power units corresponding to the plurality or substrate processing modules, respectively, each of the power units being configured to supply electric power to the corresponding processing module.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments a substrate processing system of the present disclosure will be described in detail with reference to the accompanying drawings. The following embodiments are not intended limit the substrate processing system of the present disclosure.

Recently, in substrate processing systems, the number of processing chambers has increased, and the size of units correspondingly attached to the processing chambers has increased, resulting in an increase of an installation area. For example, in the configuration in which the processing chambers and the transfer module are arranged on a different floor from the power units, which is disclosed in Japanese Patent Application Publication No. 2017-69564, the installation area is increased due to the increase in the number of the processing chambers or the increase in the size of the power units. Since a manufacturing factory has a limited space where the substrate processing systems can be disposed, it is required to suppress the increase of an installation area for each substrate processing system in order to dispose a large number of substrate processing systems in the limited space.

First Embodiment

<Configuration of a Substrate Processing System>

Figure 1:
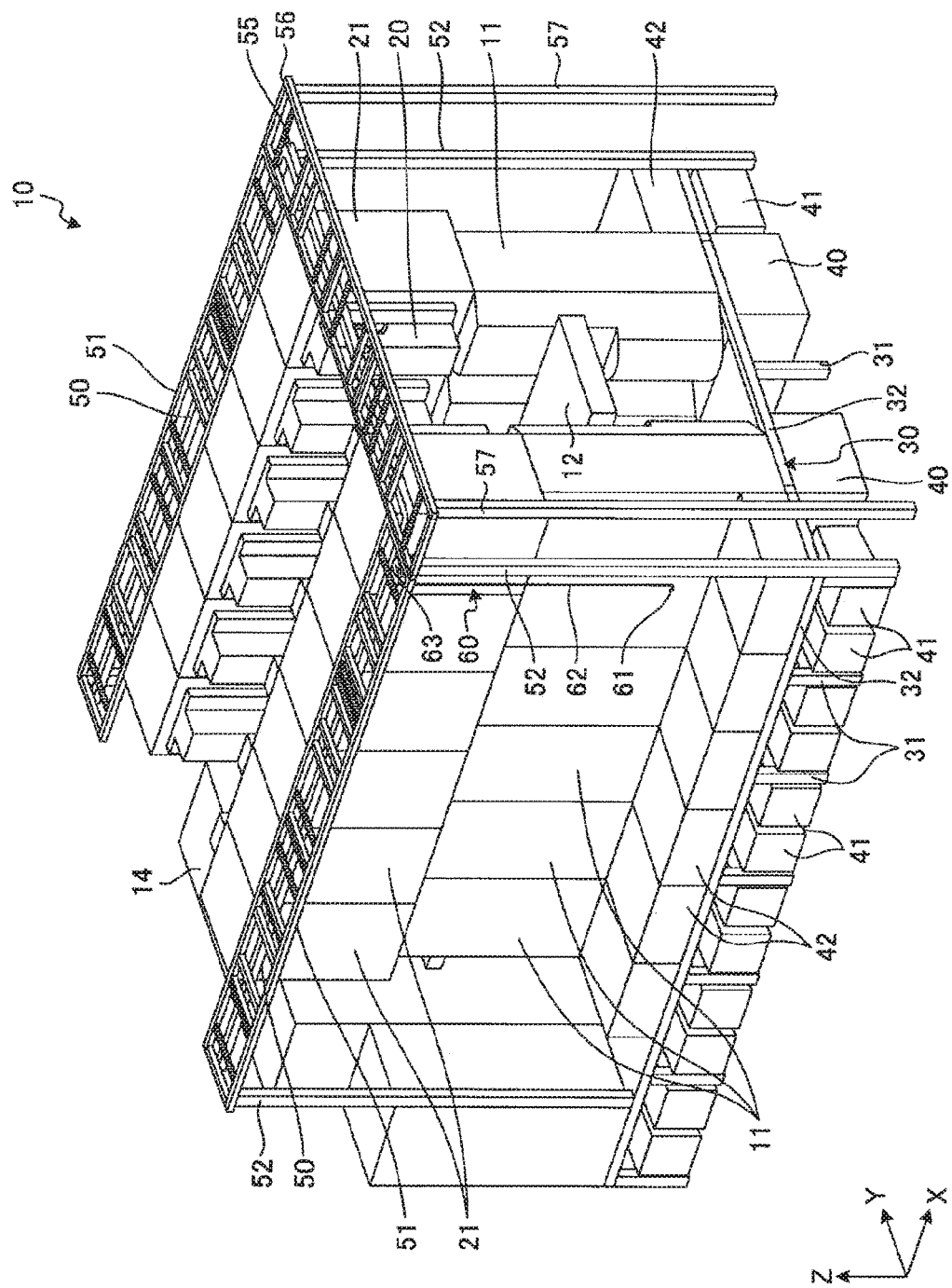
FIG. 1 is a perspective view showing an example of a schematic configuration of a substrate processing system according to a first embodiment.
Figure 2:
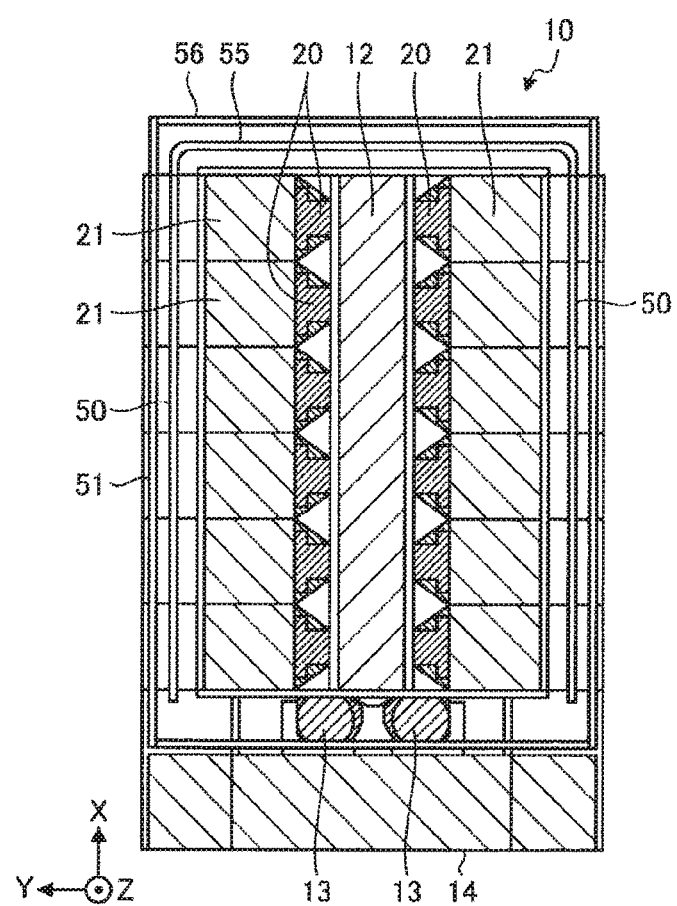
FIG. 2 is a top view showing the example of the schematic configuration of the substrate processing system according to the first embodiment.
Figure 3:
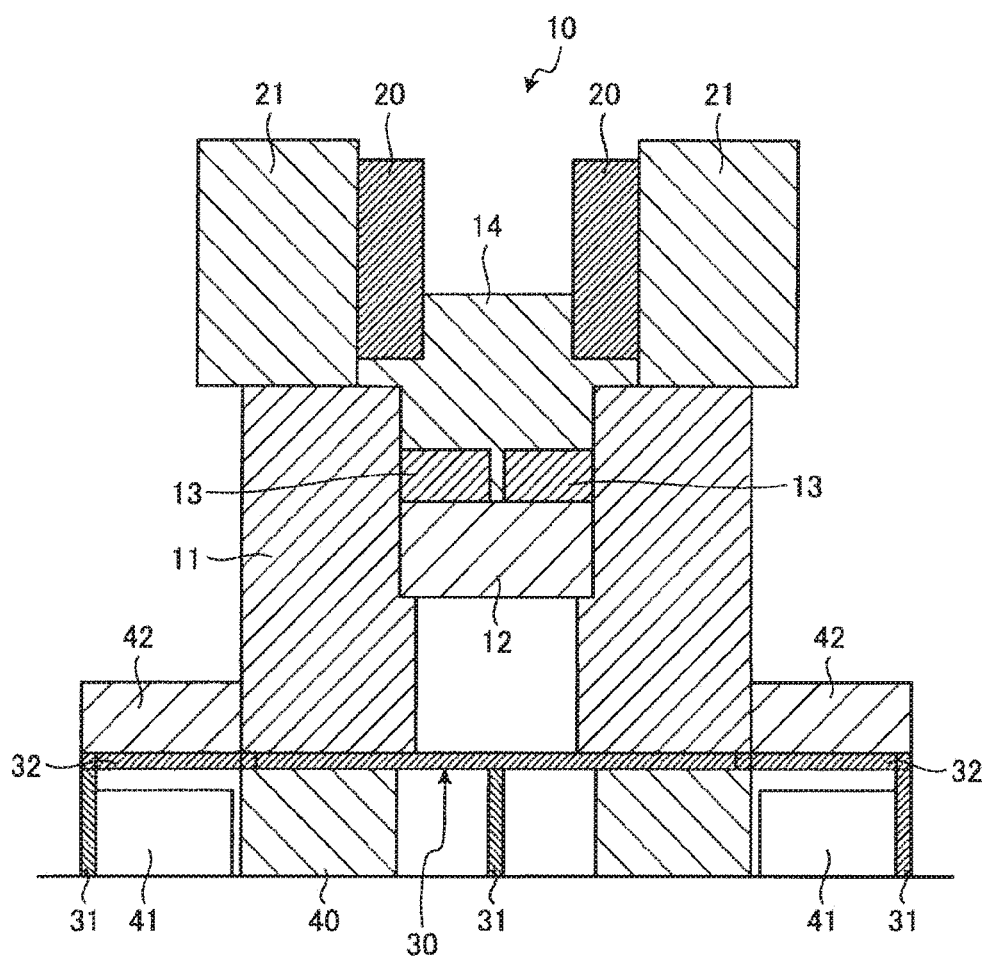
FIG. 3 is a side view showing the example of the schematic configuration of the substrate processing system according to the first embodiment.

An example of a schematic configuration of a substrate processing system according to a first embodiment will be described. FIG. 1 is a perspective view showing an example of a schematic configuration of a substrate processing system 10 according to the first embodiment. FIG. 2 is a top view showing the example of the schematic configuration of the substrate processing system 10 according to the first embodiment. FIG. 3 is a side view showing the example of the schematic configuration of the substrate processing system 10 according to the first embodiment. The substrate processing system 10 is configured to perform a variety of treatments on a substrate. In the following description, in order to clarify a geometrical relationship, the X direction, the Y direction and the Z direction that are orthogonal to each other are defined as follows. As shown in FIG. 1, the X direction and the Y direction are two horizontal directions orthogonal to each other. The Z direction is a vertical direction. FIG. 3 is a side view of the substrate processing system 10 viewed from the X direction and a rail and a frame to be described later are omitted therein.

As shown in FIG. 1, the substrate processing system 10 includes a plurality of processing modules (substrate processing modules) 11. The number of the processing modules 11 of the substrate processing system 10 is not limited to the amount shown in FIG. 1.

The processing modules 11 are arranged side by side. In the present embodiment, the processing modules 11 are linearly arranged in two rows in the X direction.

Each of the processing modules 11 is configured to perform a variety of substrate treatments on a substrate. The substrate treatments may be, for example, etching and formation of films using plasma. The substrate is a semiconductor wafer (hereinafter, also referred to as "wafer").

Each of the processing modules 11 has therein a vacuum processing chamber such as a vacuum chamber or the like and performs the substrate treatment on a wafer disposed in the vacuum processing chamber. In each or the processing modules 11, the vacuum processing chamber is maintained in a reduced atmosphere during the wafer treatment. In the substrate processing system 10, the processing modules 11 may perform the same type of substrate treatment, or some or all of the processing modules 11 may perform different types of substrate treatments. For example, in the substrate processing system 10, multiple types of substrate treatments are distributed to be performed respectively in the processing modules 11.

A vacuum transfer module (substrate transfer module) 12 is disposed between the two rows of the processing modules 11 such that the processing modules are coupled to the vacuum transfer module along a lateral side of the vacuum transfer module. As shown in FIG. 2, the vacuum transfer module 12 is formed in a long and flat rectangular shape and has therein a vacuum transfer chamber. In the vacuum transfer module 12, the vacuum transfer chamber is maintained in a reduced atmosphere during the wafer treatment. The vacuum transfer module 12 has transfer ports provided on a side surface thereof facing the processing modules 11 for transferring a wafer to the corresponding processing modules 11. Further, the vacuum transfer module 12 is electrically connected to the respective vacuum processing chambers of the processing modules 11 through the transfer ports. Gate valves (not shown) are respectively provided at the transfer ports of the vacuum transfer module 12 to open and close the transfer ports, respectively.

Two load-lock modules 13 are connected to one end of the vacuum transfer module 12 in the X direction through gate valves (not shown). The two load-lock modules 13 are connected to an atmospheric transfer module 14 through gate valves (not shown).

An atmospheric-pressure transfer module 14 is disposed on the side of the load-lock modules 13 away from the vacuum transfer module 12 with the load-lock modules 13 interposed therebetween. The atmospheric-pressure transfer module 14 is formed in a substantially rectangular shape in top view. An inner space of the atmospheric transfer module 14 is maintained in an atmospheric atmosphere. The two load-lock modules 13 are arranged along one longitudinal side of the atmospheric-pressure transfer module 14. Further, a carrier accommodating a wafer(s) can be attachable to a wall of the atmospheric-pressure transfer module 14 that is remote from the load-lock modules 13.

The atmospheric-pressure transfer module 14 has therein a transfer mechanism such as an arm to transfer the wafer between the load-lock modules 13 and the carrier using the transfer mechanism.

Each of the load-lock modules 13 is configured to control a pressure between an atmospheric pressure and vacuum pressure when the wafer is transferred between the vacuum transfer module 12 and the atmospheric-pressure transfer module 14.

In the vacuum transfer module 12, the vacuum transfer chamber has therein a transfer mechanism such as an arm to transfer the wafer between the processing modules 11 and the load-lock modules 13.

Each processing module 11 is configured to perform a substrate treatment on the wafer. For example, the processing module 11 is configured as a parallel plate type plasma processing apparatus having an upper electrode and a lower electrode in the vacuum processing chamber. A gas box 20 for supplying a processing gas to the vacuum processing chamber and an electrical unit 21 are disposed on the processing module 11. Various devices such as electrical parts for controlling the processing module 11 are contained in the electrical unit 21.

In the substrate processing system 10, it is required to suppress an increase of an installation area.

Therefore, in the first embodiment, power units, each of which is configured to supply electric power to the corresponding processing module 11, are disposed below the processing modules 11. For example, a supporting table 30, having a top plate 32 and a plurality of support columns 31 that support the top plate 32, is disposed on a floor on which the substrate processing system 10 is installed. For example, the top plate 32 of the supporting table 30 is disposed separately from the floor face by about 50 cm to 70 cm, and the supporting table 30 is configured to have sufficient weight capacity for the processing modules 11. The respective processing modules 11 are disposed on the supporting table 30. Since the supporting table 30 disposed on the floor has the top plate 32 separately disposed from the floor face, a space can be secured under the supporting table 30. In the supporting table 30, the top plate 32 extends outwardly from its center toward the external sides with respect to the processing modules 11 where the external sides are opposite to the sides where the vacuum transfer module 12 is disposed (that is, the top plate 32 extends in the Y-direction from its center and has a first portion disposed below the processing modules 11 and a second portion (a portion on the external side with respect to the processing module) extending outwardly from the first portion). The top plate 32 is configured to be partially separable.

In the substrate processing system 10, the power units are disposed in the space under the supporting table 30. In the substrate processing system 10, a power box (power controller) 40 and a pair or power generators 41 are provided as the power unit for each the processing modules 11. The power boxes 40 are disposed below a first portion of the top plate 32, the first portion being disposed below the processing modules 11. The pair of power generators 41 is provided for each of the processing modules 11 to supply radio frequency powers having different frequencies to the lower electrode, and is disposed below a second portion of the top plate, the second portion extending outwardly from the first portion.

Figure 4:
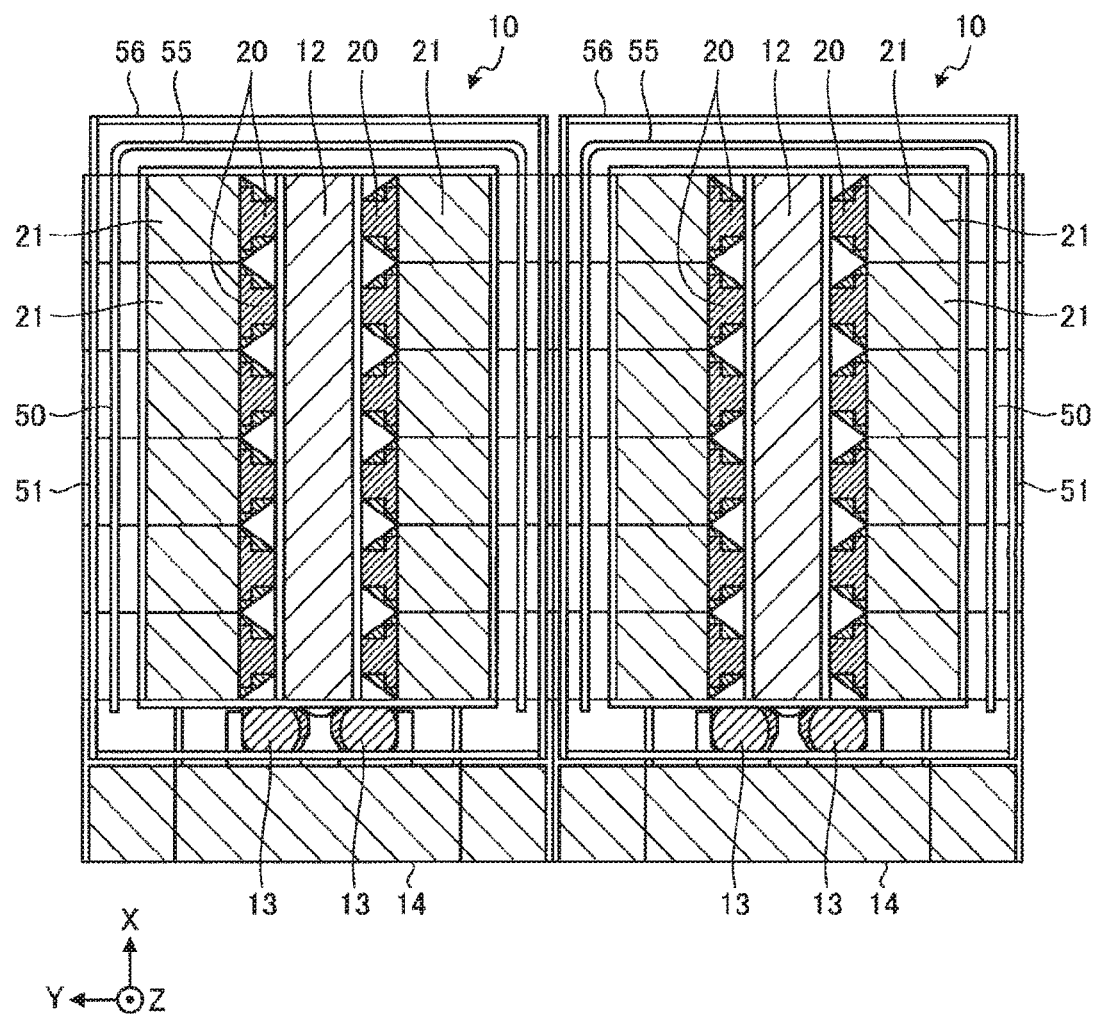
FIG. 4 is a top view showing an example in which a plurality of substrate processing systems according to the first embodiment is arranged.

Therefore, in the substrate processing system 10, the increase of the installation area can be suppressed by providing the power units for respectively supplying electric power to the processing modules 11 below the processing modules 11. Since the increase of the installation area can be suppressed, a large number of substrate processing systems 10 can be arranged in a reduced area. FIG. 4 shows an example in which a plurality of substrate processing systems 10 according to the first embodiment is arranged. Specifically, FIG. 4 shows an example in which two substrate processing systems 10 are arranged side by side along the Y-axis. Since the substrate processing systems 10 can be arranged adjacent to each other, a large number of the substrate processing system 10 can be arranged in a reduced area.

Each power box 40 is connected to a power supply line to which electric power is supplied. Conventionally, the power box 40 is disposed to be spaced apart from other units such as the processing modules 11 and the like, and a wiring area for a power supply line is provided above the power box 40, and the power supply line is provided from a position above the power box 40.

However, in the substrate processing system 10 according to the first embodiment, the power box 40 is disposed below each processing module 11, so that the power supply line cannot be provided from the position above the power box 40.

Therefore, in the substrate processing system 10 according to the first embodiment, the power box 40 is configured such that the power supply line can be provided from a side surface thereof.

Figure 5:
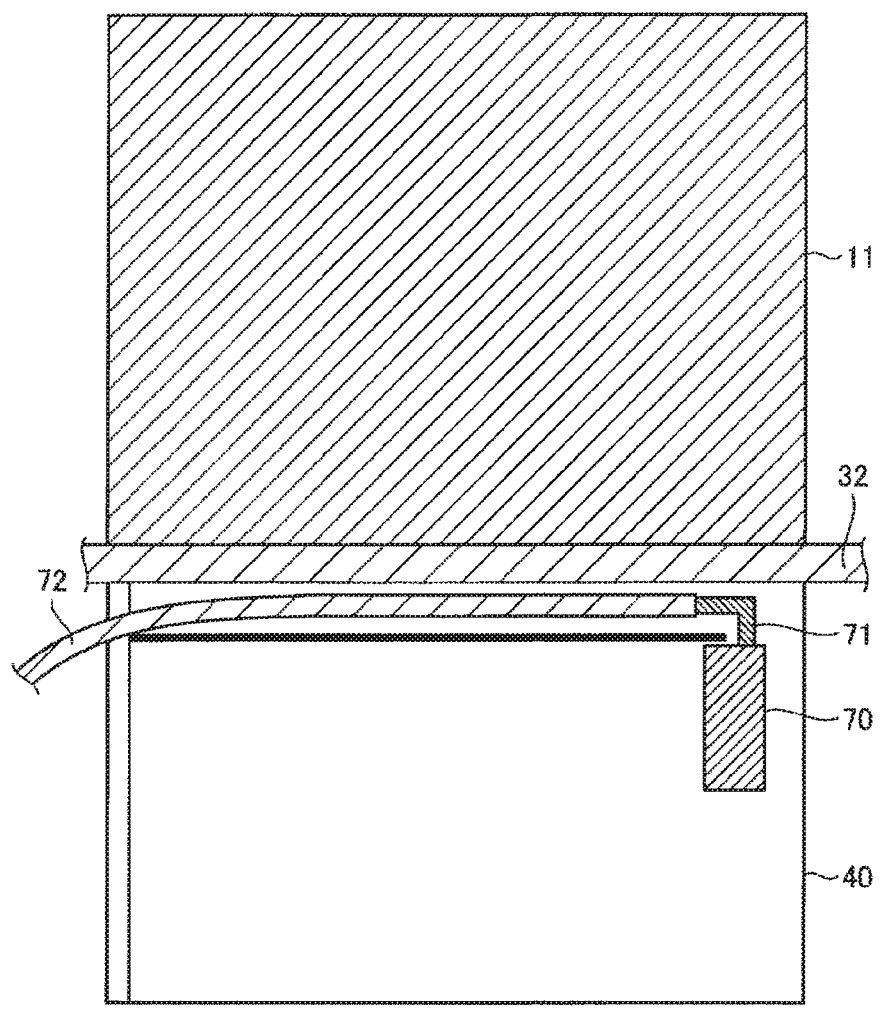
FIG. 5 shows an example of a schematic configuration of a power box of the substrate processing system according to the first embodiment.

FIG. 5 shows an example of a schematic configuration of the power box 40 of the substrate processing system 10 according to the first embodiment. The power box 40 has a breaker 70. The breaker 70 is provided with an operation member for controlling the supply of electric power, such as a switch for cutting off the electric power.

Since the breaker 70 is provided with the operation member such as the switch or the like, it is preferred that the breaker 70 is disposed at an upper portion of the power box 40. The breaker 70 is provided with a connector 71 for connecting the power supply line and the breaker 70. The connector 71 is made of a conductive metal such as copper or the like. The connector 71 may be plated with nickel or the like. The connector 71 extends upward from the breaker 70 and is bent toward one side surface of the power box 40 on the side where the vacuum transfer module 12 is disposed. A power supply line 72 is inserted into the upper portion of the power box 40 from one side surface of the power box 40 on the side where the vacuum transfer module 12 is disposed and connected to the connector 71. Accordingly, in the substrate processing system 10 according to the first embodiment, the power supply line 72 can be inserted from one side surface of the power box 40 on the side where the vacuum transfer module 12 is disposed and connected to the connector 71, which allows the breaker 70 to be disposed at the upper portion of the power box 40.

Referring back to FIG. 1, the power box 40 transforms the electric power supplied through the power supply line 72 into various voltages to be used in the processing module 11 and supplies each of the voltages to the processing module 11. Further, the power box 40 supplies the electric power to the electrical unit 21 or the power generators 41. Alternatively, electric power may be supplied to the electrical unit 21 by another power distribution system.

The generators 41 are connected to the lower electrode of the vacuum processing chamber through wirings (not shown). The power generators 41 are configured to supply the radio frequency power to the lower electrode at the time of generating plasma in the vacuum processing chamber.

Each processing module 11 performs, on the wafer, a substrate treatment using plasma generated by applying radio frequency powers having different frequencies from the two power generators 41 to the lower electrode while supplying a processing gas from the gas box 20 to the vacuum processing chamber.

On the second portion of the top plate 32, storage boxes 42 are respectively provided for the processing modules 11. Each of the storage boxes 42 has therein devices related to the corresponding processing module 11. For example, when the processing module 11 performs a temperature control of the wafer, the storage box 42 corresponding thereto has therein a temperature control unit. The storage box 42 may be empty. The storage box 42 has a flat top surface that is configured to have a weight capacity of several hundred kilograms so that a person can stand thereon. In the substrate processing system 10, a person can stand and move on the top surfaces of the storage boxes 42 disposed on the supporting table 30 and, thus, the person can move along the processing modules 11.

However, in the substrate processing system 10, sizes and weights of various units provided for each of the processing modules 11 tend to be increased. Further, in the substrate processing system 10, the removal of large and heavy units becomes frequently necessary for maintenance or the like. Further, in order to dispose a large number of substrate processing systems 10 in the manufacturing factory, it is difficult to provide a large space for maintenance work. For example, as shown in FIG. 4, when two substrate processing systems 10 are arranged side by side along the Y-axis, there is no space between the substrate processing systems 10.

Therefore, in the substrate processing system 10, a rail 50 is disposed above the second portion of the top plate 32 at a height above a height of an electrical unit 21 and extends along each of the two rows of the processing modules 11. Each rail 50 is supported by a frame 51. The frame 51 is installed and extends along the alignment direction of the processing modules 11 at the same height as that of the rail 50, and is supported by a plurality of support columns 52.

In the substrate processing system 10, a rail 55 and a frame 56 are installed on the other end of the vacuum transfer module 12 in the X direction where the load-lock modules 13 are not disposed. The rail 55 is curved at end portions thereof and is connected to the ends of the rails 50 of the two rows of the processing modules 11. The frame 56 is connected to the frames 51 of the two rows of the processing modules 11 and is supported by a plurality of support columns 57.

Figure 6:
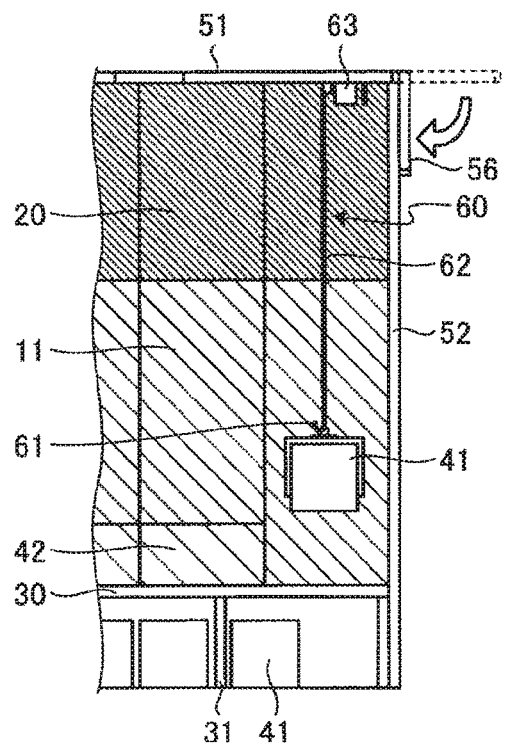
FIG. 6 shows a state in which a rail and a frame are folded in the substrate processing system according to the first embodiment.
Figure 7:
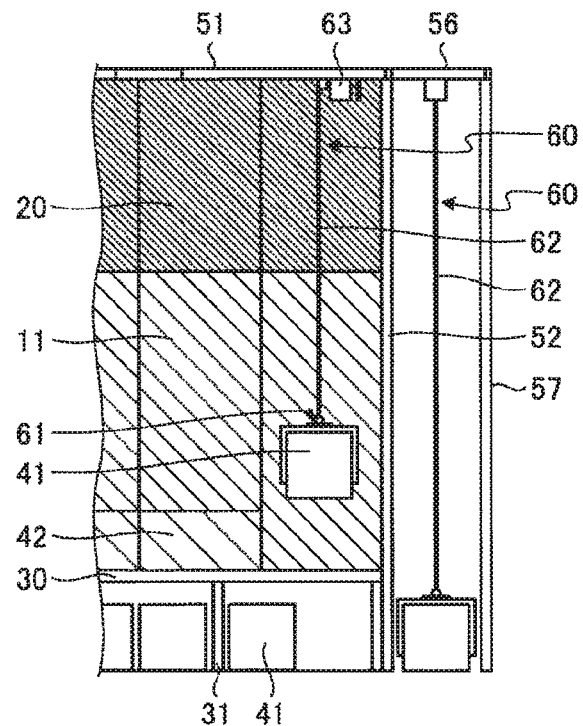
FIG. 7 shows a state in which the rail and the frame are unfolded for maintenance work in the substrate processing system according to the first embodiment.

The rail 55 and the frame 56 are disposed at a position outside of the processing module 11 at the other end in the X direction, which may cause interference when moving an object. Therefore, the support columns 57 are configured to be removable. Further, the rail 55 and the frame 56 may be folded by allowing connection portions, to which the rails 50 and the frames 51 are connected, to be downwardly rotatable. FIG. 6 shows a state in which the rail 55 and the frame 56 are folded in the substrate processing system 10 according to the first embodiment. FIG. 7 shows a state in which the rail 55 and the frame 56 are unfolded for maintenance work in the substrate processing system 10 according to the first embodiment. In all the cases except for maintenance work, the rail 55 and the frame 56 are folded as shown in FIG. 6 to prevent interference when moving the object. At the time of maintenance work, as shown in FIG. 7, the rail 55 and the frame 56 are rotated to maintain the horizontal state and the support columns 57 are installed.

A suspending mechanism is provided on the rails 50 and 55 to suspend a unit such as the power controller from the rails 50 and 55 and transfer the suspended unit along the rails 50 and 55. For example, a crane 60 serving as a suspending mechanism is detachably attached to the rails 50 and 55. The crane 60 is movable along the rails 50 and 55, i.e., the X-axis and the Y-axis. The crane 60 is provided with a winch 63 on which a wire 62 is wound. A hook 61 is fixed to a tip end of the wire 62. The crane 60 is configured to vertically move the hook 61 along the Z-axis by rotating the winch 63. The winch 63 may be electrically or manually rotated.

In the substrate processing system 10, at the time of maintenance work, the hook 61 of the crane 60 holds a maintenance target unit, and the maintenance target unit is raised by rotating the winch 63. Then, the crane 60 is moved along the rails 50 and 55. Accordingly, in the substrate processing system 10, it is possible to easily move a large and heavy unit.

Figure 8:
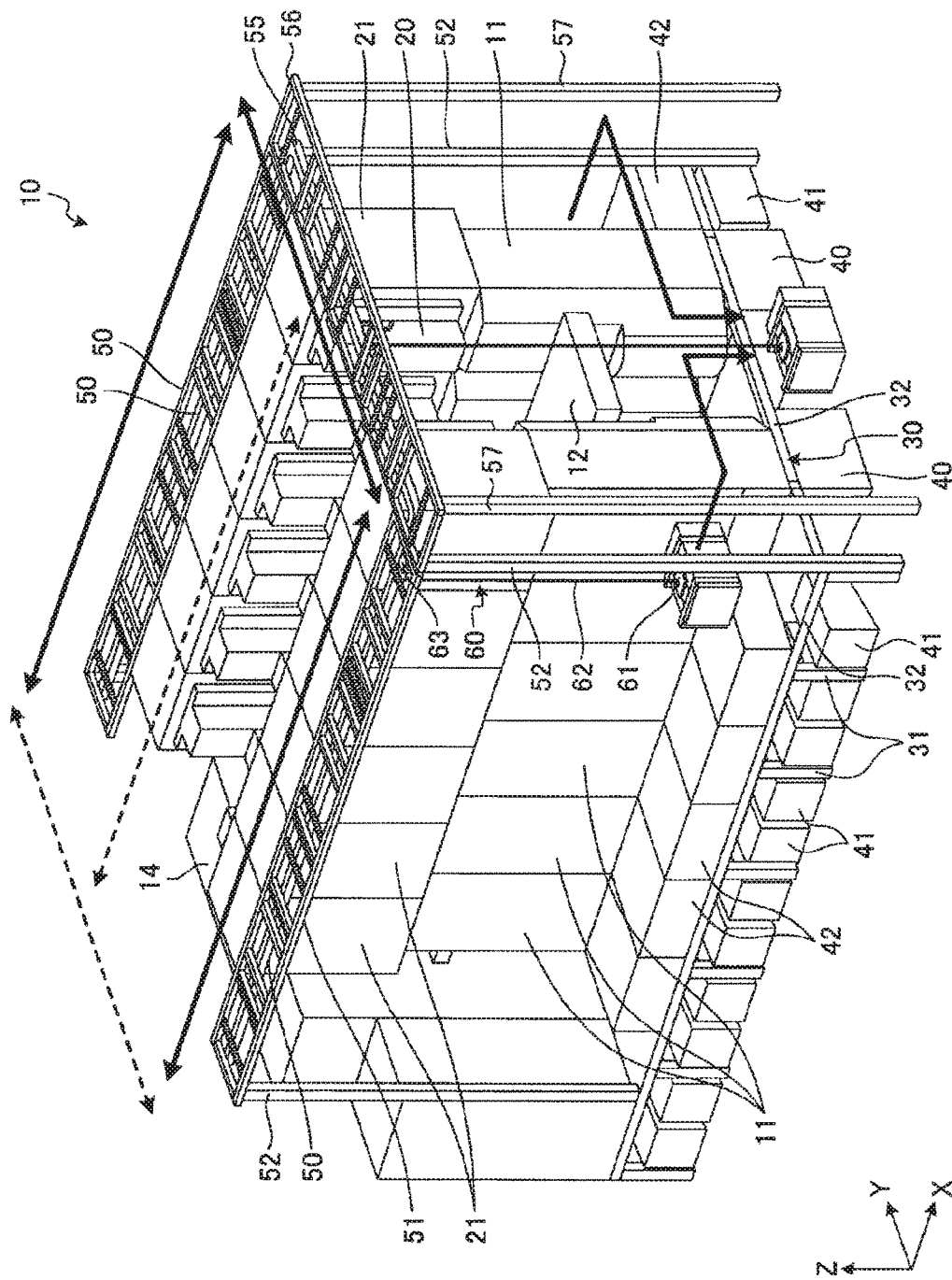
FIG. 8 shows an example of moving a unit of the substrate processing system according to the first embodiment.

FIG. 8 shows an example of moving a unit of the substrate processing system 10 according to the first embodiment. FIG. 8 shows a case where the power generator 41 is extracted for maintenance work, for example. The crane 60 is movable along the rails 50 and 55. First, the storage box 42 and a part of the top plate 32 that is provided above the target power generator 41 that is a maintenance target are separated. Next, the hook 61 of the crane 60 holds the target power generator 41, and the winch 63 is rotated to raise the target power generator 41. Then, the crane 60 is moved along the rails 50 and 55, and then the hook 61 is lowered by rotating the winch 63 to an appropriate position to thereby lower the target power generator 41. In the example of FIG. 8, the target power generator 41 is moved toward the other end in the X direction. In this manner, the substrate processing system 10 is configured to easily move the target power generator 41. Since the target power generator 41 is movable in the substrate processing system 10 to wider work space, maintenance work can be facilitated.

As described above, FIGS. 2 and 8 show the case where the rails 50 are disposed above the second portion of the top plate 32 and extend respectively along the two rows of the processing modules 11 (i.e., the alignment direction of the processing modules). However, the present disclosure is not limited thereto, and the rails may be installed at other positions. For example, the rails may be installed above the vacuum transfer module 12 or above the atmospheric-pressure transfer module 14. Further, the rails may be installed whenever it is necessary for maintenance work or the like. In this case, the substrate processing system 10 is configured to move the crane 60 along the vacuum transfer module 12 (the X-axis) or the atmospheric-pressure transfer module 14 (the Y-axis) at the positions above the vacuum transfer module 12 or above the atmospheric-pressure transfer module 14 as indicated by dashed arrows in FIG. 8. Accordingly, the units near the vacuum transfer module 12 and the atmospheric-pressure transfer module 14 can be easily moved.

Figure 9:
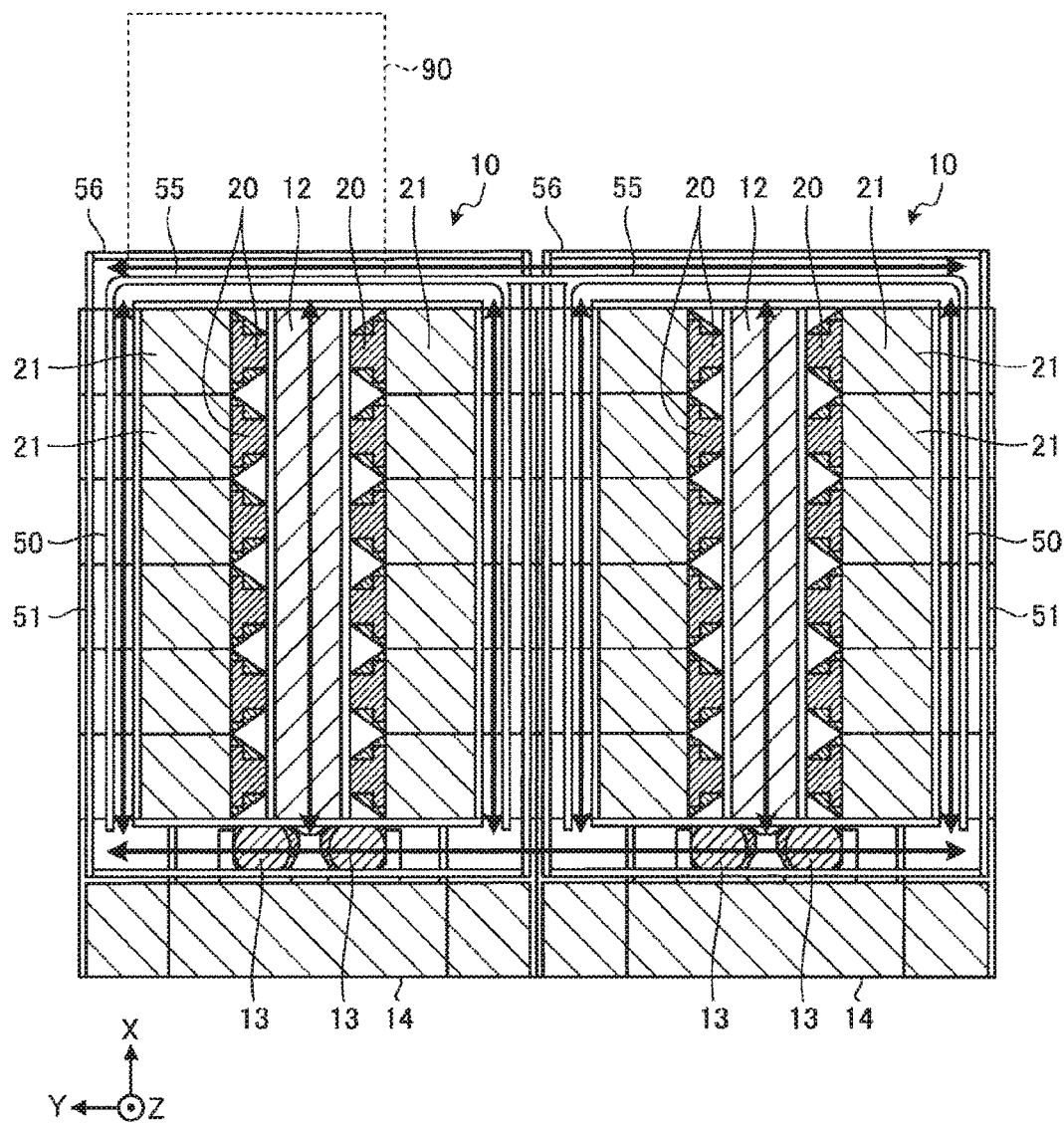
FIG. 9 is a top view showing an example in which a plurality of substrate processing systems according to the first embodiment is arranged.

Further, when a plurality of substrate processing systems 10 is arranged, the rails 55 thereof may be connected to each other. For example, a switching mechanism is provided at a portion of connecting one rail 55 with the rail 50 to switch the connection portion from a connection of one rail 55 with the rail 50 to a connection of one rail 55 to another rail 55. FIG. 9 shows an example in which a plurality of substrate processing systems 10 according to the first embodiment is arranged. FIG. 9 shows an example in which two substrate processing systems 10 are arranged side by side along the Y-axis and the rails 55 thereof are connected to each other. In FIG. 8, the movable range of the crane 60 is indicated by solid arrows. The crane 60 can be moved between the substrate processing systems 10 through the rails 55. Accordingly, for example, when a large work space 90 can be provided near one substrate processing system 10, a unit of another substrate processing system 10 can be moved to the space 90.

As described above, the substrate processing system 10 according to the present embodiment includes the multiple processing modules 11 and the multiple power units. Each of the processing modules 11 is configured to perform treatment of a substrate, and the processing modules 11 are disposed side by side. The power units are disposed below the processing modules 11, respectively, and individually supply electric power to the corresponding processing modules 11. Accordingly, in the substrate processing system 10, an increase of the installation area can be suppressed.

Further, the supporting table 30 is disposed between the processing modules 11 and the floor face. The power units are disposed below the supporting table 30. Accordingly, in the substrate processing system 10, the processing modules 11 and the power units can be vertically stacked with the supporting table 30 interposed therebetween, so that the increase of the installation area can be suppressed.

Further, the substrate processing system 10 according to the present embodiment includes the vacuum transfer module 12. The vacuum transfer module 12 is disposed to extend along one side of the side surfaces of the processing modules 11 and is configured to transfer a wafer to each processing module 11. In the supporting table 30, the top plate 32 extends outwardly from its center toward the external sides with respect to the processing modules 11 where the external sides are opposite to the sides where the vacuum transfer module 12 is disposed. The top plate 32 on the external sides with respect to the processing modules 11 (i.e., the second portion of the top plate 32) is separable. The substrate processing system 10 includes the power boxes 40 and the power generators 41 as the power units. The power boxes 40 respectively disposed below the processing modules 11. The power generators 41 are disposed below the top plate 32 on the external side with respect to the processing modules 11 (i.e., the second portion of the top plate 32). Accordingly, in the substrate processing system 10, the processing modules 11 and the power boxes 40 can be vertically stacked, which makes it possible to suppress an increase of the installation area. Further, in the substrate processing system 10, the power generators 41 are disposed below the separable part of the top plate 32, so that a space can be secured on the top plate 32. The maintenance work for the power generators 41 disposed below the separable part of the top plate 32 can be performed by separating the separable part of the top plate 32.

Further, the substrate processing system 10 according to the present embodiment includes the rail 50 and the crane 60. The rail 50 is disposed above the external sides with respect to the processing modules 11 (i.e., the second portion of the top plate 32) and extends along the alignment direction of the processing modules 11. The crane 60 is attached to the rail 50 and can move vertically along the Z-axis while holding the power generator 41. The crane 60 can also move along the rail 50, i.e., the X-axis. Accordingly, the substrate processing system 10 can easily move the power generator 41.

Further, the substrate processing system 10 according to the present embodiment includes the vacuum transfer module 12. The vacuum transfer module 12 is disposed to extend along one side of the side surfaces of the processing modules 11 and transfers a wafer to each processing module 11. The power boxes 40 are disposed vertically adjacent to the bottoms of the processing modules 11. The breaker 70 provided with the connector 71 that is bent toward one side surface of each of the power boxes 40 and connected to the power supply line 72 is disposed at the upper portion of each of the power boxes 40. Accordingly, in the substrate processing system 10, even when the power boxes 40 are disposed vertically adjacent to the bottoms of the processing modules 11, the breaker 70 can be disposed at the upper portion of each of the power boxes 40.

Second Embodiment

Next, an example of a schematic configuration of a substrate processing system 10 according to a second embodiment will be described. The substrate processing system 10 according to the second embodiment has a similar configuration in part to that of the substrate processing system 10 according to the first embodiment shown in FIGS. 1 to 9. Therefore, like reference numerals will be given to like parts, and only the differences will be mainly described.

Figure 10:
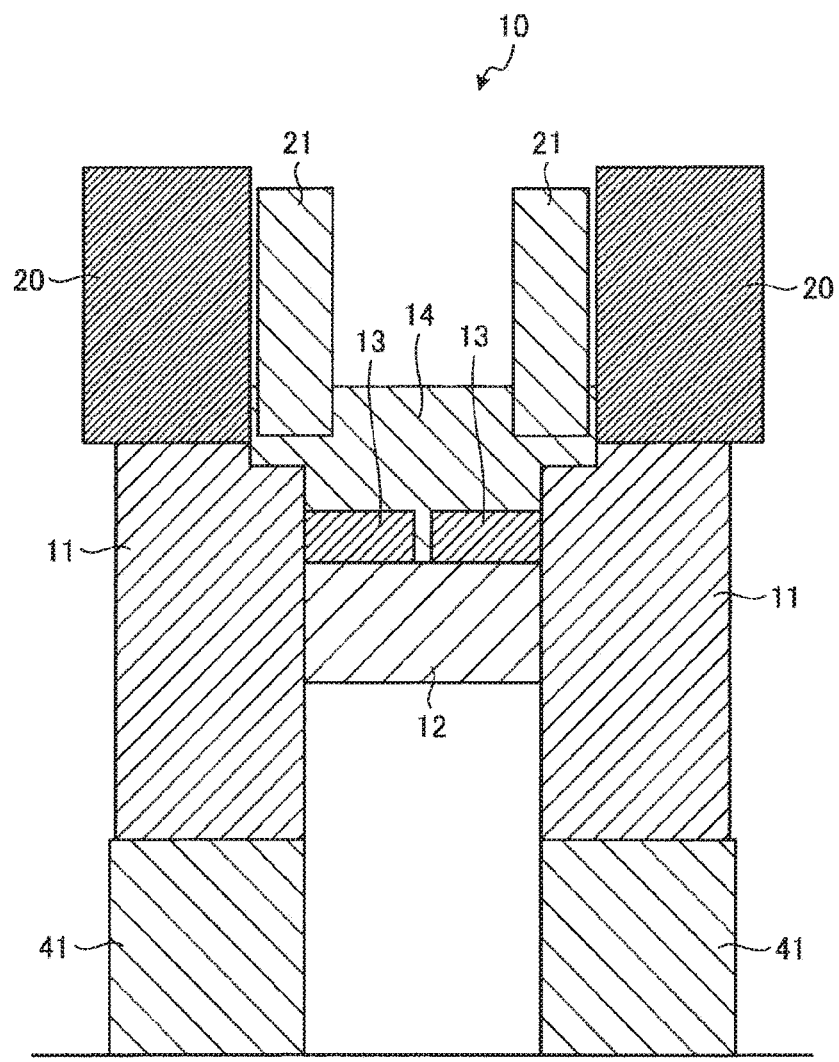
FIG. 10 is a side view showing an example of a schematic configuration of a substrate processing system according to a second embodiment.

FIG. 10 is a side view showing an example of a schematic configuration of the substrate processing system 10 according to the second embodiment. In the same manner as the first embodiment, in the substrate processing system 10 according to the second embodiment, power units for respectively supplying electric power to the processing modules 11 are disposed under the processing modules 11. For example, the power generators 41 are disposed on a floor where the substrate processing system 10 is installed, and the processing modules 11 are disposed on top of the power generators 41. In other words, the power generators 41 are disposed vertically adjacent to the bottoms of the processing modules 11. The power generators 41 may be disposed vertically adjacent to the bottoms of the processing modules 11 while being respectively accommodated in storage boxes or the like. Further, the power boxes 40 may be disposed on the external sides with respect to the processing modules 11 or may be disposed separated therefrom. Further, the power boxes 40 may be disposed on a floor different from the floor where the processing modules 11 and the power generators 41 are disposed. For example, the power boxes 40 may be disposed on a floor below the floor where the processing modules 11 and the power generators 41 are disposed. Alternatively, the power boxes 40 may be disposed under the processing modules 11. Further, alternatively, the power boxes 40 and the power generators 41 may be disposed on a floor different from the floor where the processing modules 11 are disposed. For example, the power boxes 40 and the power generators 41 may be disposed on a floor below the floor where the processing modules 11 are disposed.

As described above, in the substrate processing system 10, the increase of the installation area can be suppressed by arranging the power units for respectively supplying electric power to the processing modules 11 below the processing modules 11.

In the case where the processing modules 11 are disposed on the power generators 41 installed on the floor, the height of the substrate processing system 10 from the floor is increased. In the manufacturing factory, there is a limit in the height of the substrate processing system 10 that can be installed. Therefore, it is preferable to maintain the height of the substrate processing system 10 from the floor below a certain height. For example, it is preferable that the substrate processing system 10 is configured such that the height of the bottom surface of the vacuum transfer module 12 from the floor is 180 cm or less, and it is more preferable that the height of the bottom surface of the vacuum transfer module 12 from the floor is 170 cm or less. Accordingly, the height of the substrate processing system 10 from the floor can be suppressed.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, the first embodiment has described the case where the storage boxes 42 are disposed on the top plate 32. However, the present disclosure is not limited thereto, and the storage boxes 42 may be omitted.

Although a semiconductor wafer has been described as an example of a substrate in the above-described embodiments, the semiconductor wafer may be silicon or may be a compound semiconductor such as GaAs, SiC, GaN, or the like. Further, a ceramic substrate and a glass substrate used for flat panel display (FPD) such as a liquid crystal display or the like may be employed as the substrate without being limited to the semiconductor wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing system installed on a floor face, comprising:
    a substrate transfer module having a vacuum transfer chamber therein;
    a supporting table including a top plate disposed separately from the floor face;
    a plurality of substrate processing modules disposed on the top plate and coupled to the substrate transfer module along a lateral side of the substrate transfer module; and
    a plurality of power units disposed below the top plate, the plurality of power units corresponding to the plurality of substrate processing modules, respectively, each of the power units being configured to supply electric power to the corresponding processing module,
    wherein the top plate includes a first portion disposed below the plurality of substrate processing modules, and a second portion outwardly extending from the first portion,
    the power units include power controllers and power generators, the power controllers are disposed below the first portion of the top plate and the power generators are disposed below the second portion of the top plate, and
    the substrate processing system further comprises a rail disposed above the second portion of the top plate and extending along an alignment direction of the plurality of substrate processing modules, and a suspending mechanism configured to suspend any one of the power generators from the rail and transfer the suspended power generator along the rail.

2. The substrate processing system of claim 1, wherein each of the power units includes a breaker and a power supply line that are disposed at an upper portion of the power unit, and a bent connector that connects the breaker and the power supply line.

* * * * *